United States Patent [19]

Callahan

[11] Patent Number: 4,898,544
[45] Date of Patent: Feb. 6, 1990

[54] FLAT CABLE SUPPORT COMB

[75] Inventor: Thomas Callahan, Wakefield, Mass.

[73] Assignee: Thinking Machines Corporation, Cambridge, Mass.

[21] Appl. No.: 172,143

[22] Filed: Mar. 23, 1988

[51] Int. Cl.⁴ ............................................. H01R 9/07
[52] U.S. Cl. ..................................... 439/498; 439/470
[58] Field of Search .............................. 439/492–499, 439/502, 65, 67, 77, 470; 174/117 F, 117 FF

[56] References Cited

U.S. PATENT DOCUMENTS

| | | | |
|---|---|---|---|
| 3,296,365 | 1/1967 | Basile | 174/117 FF |
| 3,818,122 | 6/1974 | Luetzow | 174/117 FF |
| 3,878,341 | 4/1975 | Balde | 439/493 |
| 3,920,301 | 11/1975 | Roberts et al. | 339/17 |
| 3,932,018 | 1/1976 | Parsons et al. | 339/99 |
| 3,978,291 | 8/1976 | Bergeron, Jr. et al. | 179/16 |
| 4,065,199 | 12/1977 | Andre et al. | 439/498 |
| 4,094,568 | 6/1978 | Lee et al. | 339/17 |
| 4,219,928 | 9/1980 | Kuo | 174/117 FF |
| 4,373,765 | 2/1983 | Ritter | 339/75 |
| 4,443,050 | 4/1984 | Taylor | 339/99 |
| 4,488,763 | 12/1984 | Ritter | 339/17 |
| 4,558,916 | 12/1985 | Hehl | 339/107 |

FOREIGN PATENT DOCUMENTS 0022427 2/1977 Japan .................................. 439/494

Primary Examiner—David Pirlot
Attorney, Agent, or Firm—Weingarten, Schurgin, Gagnebin & Hayes

[57] ABSTRACT

A printed circuit board interconnect system having flat or ribbon cable folded in a pattern and supported in that pattern so that a large number of boards in an upper rack can be connected each by a respective cable to corresponding boards among a large number of boards in a lower rack in an orderly fashion while preserving the pin orientation for the boards. The cables are each folded at the ends in right angle bends that convert the horizontal direction to vertical but reverses the conductor orientation. In a central portion of the vertical extending cable, it is folded in two further right angle bends and mid way between them with a 180 degree bend. The central bend reestablishes the conductor orientation. A multi-row comb serves to support the ribbon cable in the central region and keep one cable separate from another.

6 Claims, 1 Drawing Sheet

FLAT CABLE SUPPORT COMB

FIELD AND BACKGROUND

In the fabrication of multiprocessor computers it is often necessary to connect racks of printed circuit boards together. Even using ribbon cable which conveniently bunches into a flat cable all the conductors between two circuit boards, the assemblage of cable can be a tangle preventing access between the boards and making cable or board replacement or testing all but impossible.

BRIEF SUMMARY OF THE INVENTION

According to the teaching of the present invention a printed circuit board interconnect system is provided having flat or ribbon cable folded in a pattern and supported in that pattern so that a large number on boards in an upper rack can be connected each by a respective cable to corresponding boards among a large number of boards in a lower rack in an orderly fashion while preserving the pin orientation for the boards. The cables are each folded at the ends in right angle bends that convert the horizontal direction to vertical but reverses the conductor orientation. In a central portion of the vertical extending cable, it is folded in two further right angle bends and mid way between them with a 180 degree bend. The central bend reestablishes the conductor orientation. A multi-row comb serves to support the ribbon cable in the central region and keep one cable separate from another.

DESCRIPTION OF THE DRAWINGS

These and other features of the present invention are more fully set forth in the accompanying solely exemplary detailed description and drawing of which.

DETAILED DESCRIPTION

The present invention contemplates a ribbon cable interconnect system for connecting vertically separated racks of printed circuit boards in an orderly manner with the pin orientation preserved.

Figure 1:
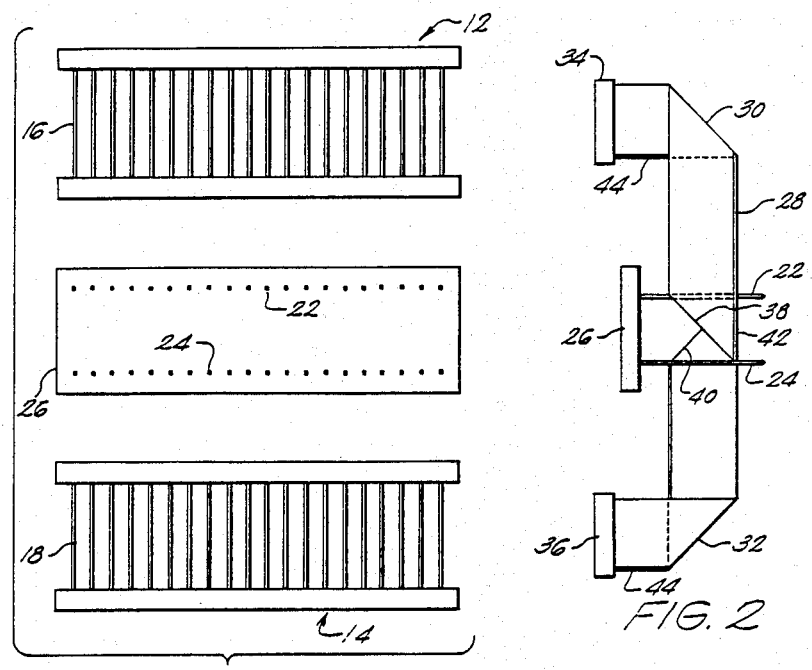
FIG. 1 is a diagram of racked circuit boards and comb according to the present invention.

In FIG. 1 there is shown a typical multi rack arrangement of upper and lower racks 12 and 14 respectively of printed circuit boards 16 and 18. It is desired to connect the boards together with ribbon cable such that, for example, aligned boards 16 and 18 from the two racks 12 and 14 are connected by connectors at their rearward ends. Using a ribbon connector or cable it is necessary to fold the cable once at each end to direct the cable between horizontal and vertical so as to make the connection. In so doing, however, the pin orientation is lost. For example, if the convention is with the ground at the bottom, the upper cable will be connected correctly, but with just two folds, the bottom cable will be oriented with the ground at the top.

It is, of course, possible to just let the cable dangle and twist so as to achieve the correct pin orientation, but the multiplicity of cables then makes a mess.

Figure 2:
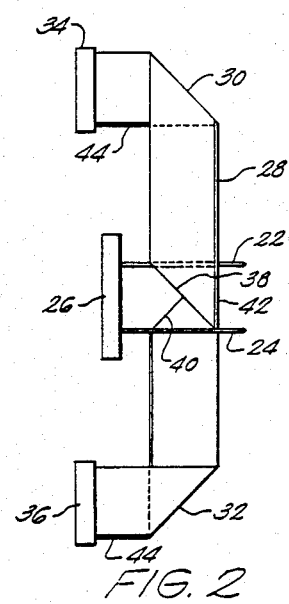
FIG. 2 is a diagram of a folded and comb supported ribbon cable according to the present invention.
Figure 3:
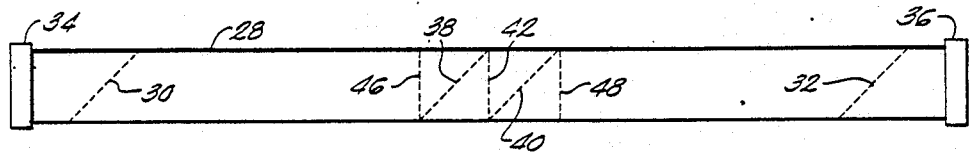
FIG. 3 is a diagram of the placing of folds in a ribbon cable according to the present invention.

A multi conductor cable 28 folded according to FIG. 2 at the fold lines shown in FIG. 3 provides a connection system in which the pin orientation is preserved and the cable remains in a single plane allowing it to be located between the teeth of the rows of teeth 20 and 22 of a comb 24. The cable has first and second right angle folds 30 and 32 at its respective ends adjacent the connectors 34 and 36. In a central region the cable is given two more right angle folds 38 and 40 and a 180 degree fold between them. Thus, the folded cable 28 has its connectors positioned with the same pin orientation at top and bottom. This can be seen from the position of the edge 44 of the cable 28 at the two connectors 34 and 36 and by tracing it through the folds.

The folded cable is best held in place by placing the central region around opposite pairs of pins 22 and 24. Alternatively, two further 180 degree fields 46 and 48 can be made in the cable 28 around each of the pins 22 and 24 directing the cable back upward and downward without altering the pin orientation.

The thus described invention can be utilized in other forms, being limited only as defined in the following claims.

I claim:

1. A printed circuit board interconnect system comprising:
   a ribbon cable and terminal connectors for interconnecting first and second printed circuit boards located in separated racks and in substantially the same or parallel planes and having connectors at ends thereof with the same pin orientation;
   said cable folded in a manner to interconnect said first and second printed circuit boards through the respective cable and board connectors with correct pin orientation with said cable as folded lying in substantially one plane;
   the folded cable having first and second right angle folds adjacent the cable connectors and a central pair of right angle folds separated by a 180 degree fold in a central region of the cable, and said cable having a further 180 degree fold adjacent each right angle fold in the central region; and
   means for positioning said cable in said central region.

2. The interconnect system of claim 1 wherein said positioning means includes a comb having two rows of teeth with one tooth from each row of teeth adapted to support opposite sides of said cable in the central region.

3. The interconnect system of claims 1 or 2 further including:
   a plurality of first and second printed circuit boards in side by side arrangement; and
   a plurality of said ribbon cables interconnecting corresponding ones of said first and second boards.

4. A process for interconnecting printed circuit boards comprising the steps of:
   folding a ribbon cable at its ends adjacent connectors thereon with respective right angle bends;
   folding said cable in a central portion with two right angle bends separated by a 180 degree bend;
   folding said cable in said central portion with a further 180 degree fold adjacent each right angle fold in said central region; and
   interconnecting two circuit boards with the cable as folded.

5. The process of claim 4 further including the step of positioning said central portion with a plurality of teeth of a until row comb.

6. A folded printed circuit board interconnect cable comprising:

a ribbon cable having a plurality of conductors therein folded at its ends adjacent connectors thereon with respective right angle folds;

said cable having said plurality of conductors folded in a central portion with two right angle folds separated by a 180 degree fold and further 180 degree folds in the central region on either side of the right angle folds.

* * * * *

UNITED STATES PATENT AND TRADEMARK OFFICE
CERTIFICATE OF CORRECTION

PATENT NO. : 4,898,544
DATED : February 6, 1990
INVENTOR(S) : Thomas Callahan

It is certified that error appears in the above-identified patent and that said Letters Patent is hereby corrected as shown below:

In Column 2, line 14, "180 degree fields" should read --180 degree folds--.

In Column 2, line 66, "a until row" should read --a multi row--.

Signed and Sealed this

Fifteenth Day of September, 1992

Attest:

DOUGLAS B. COMER

*Attesting Officer*  *Acting Commissioner of Patents and Trademarks*